US 6,653,551 B2

(12) United States Patent
Chen

(10) Patent No.: US 6,653,551 B2
(45) Date of Patent: Nov. 25, 2003

(54) STATIONARY PHOTOVOLTAIC ARRAY MODULE DESIGN FOR SOLAR ELECTRIC POWER GENERATION SYSTEMS

(76) Inventor: Leon L. C. Chen, 126-03 $7^{th}$ Ave., College Point, NY (US) 11356

( * ) Notice: Subject to any disclaimer, the term of this patent is extended or adjusted under 35 U.S.C. 154(b) by 0 days.

(21) Appl. No.: 10/269,182

(22) Filed: Oct. 11, 2002

(65) Prior Publication Data

US 2003/0075213 A1 Apr. 24, 2003

Related U.S. Application Data

(63) Continuation-in-part of application No. 10/047,151, filed on Oct. 23, 2001.

(51) Int. Cl.$^7$ .......................... H01L 31/052; F24J 2/08; F24J 2/12
(52) U.S. Cl. ...................... 136/246; 136/259; 126/683; 126/643; 359/742; 359/727; 60/641.15
(58) Field of Search ................................ 136/246, 259; 126/683, 643; 359/742, 727; 60/641.15

(56) References Cited

U.S. PATENT DOCUMENTS

| | | | | |
|---|---|---|---|---|
| 4,003,638 A | * | 1/1977 | Winston | 359/852 |
| 4,114,592 A | * | 9/1978 | Winston | 126/683 |
| 4,238,246 A | * | 12/1980 | Genequand et al. | 136/248 |
| 5,118,361 A | * | 6/1992 | Fraas et al. | 136/246 |
| 5,505,789 A | | 4/1996 | Fraas et al. | 136/246 |
| 6,384,320 B1 | | 5/2002 | Chen | 136/246 |
| 6,440,769 B2 | * | 8/2002 | Peumans et al. | 438/65 |
| 2003/0075212 A1 | * | 4/2003 | Chen | 136/246 |

OTHER PUBLICATIONS

Collares–Pereira et al, "High Temperature Solar Collector of Optimal Concentration—Non–Focusing Lens with Secondary Concentrator," SUN Proceedings Int'l Solar Energy Society Congress, New Delhi, India, Jan. 1978, Pergamon Press, 1978.*

* cited by examiner

Primary Examiner—Alan Diamond
(74) Attorney, Agent, or Firm—Collard & Roe, P.C.

(57) ABSTRACT

A stationary solar photovoltaic array module design, which constitutes four steps of optical concentrations of photovoltaic electric power generation systems. A compound parabolic concentrator (CPC) is mounted under a first and second optical concentrating fresnel lenses that concentrates the intensity of sunlight. Then the focused sunlight is further concentrated twenty times by the third optical concentrator CPC. The high mirror quality of CPC allows 98% of the reflected rays to be focused at the bottom of the CPC. At this point, the intensified sunlight is homogenized as it passes through a fourth optical concentrator glass lens, which with anti-reflection coating on the top of the glass lens' surface, incident on the multi-junction solar cell accomplish the fourth optical concentration for the photovoltaic electric energy conversion.

36 Claims, 5 Drawing Sheets

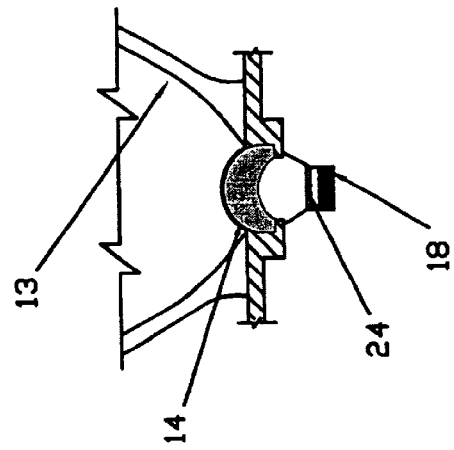
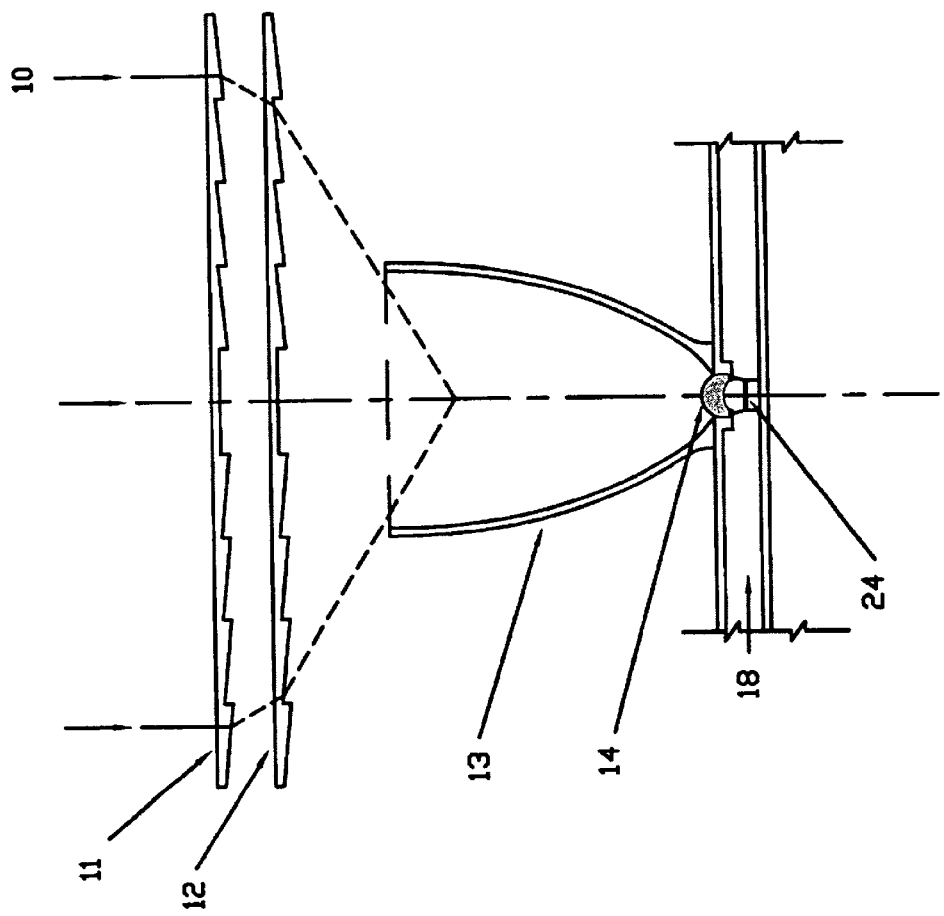
Figure 2b
Figure 2a

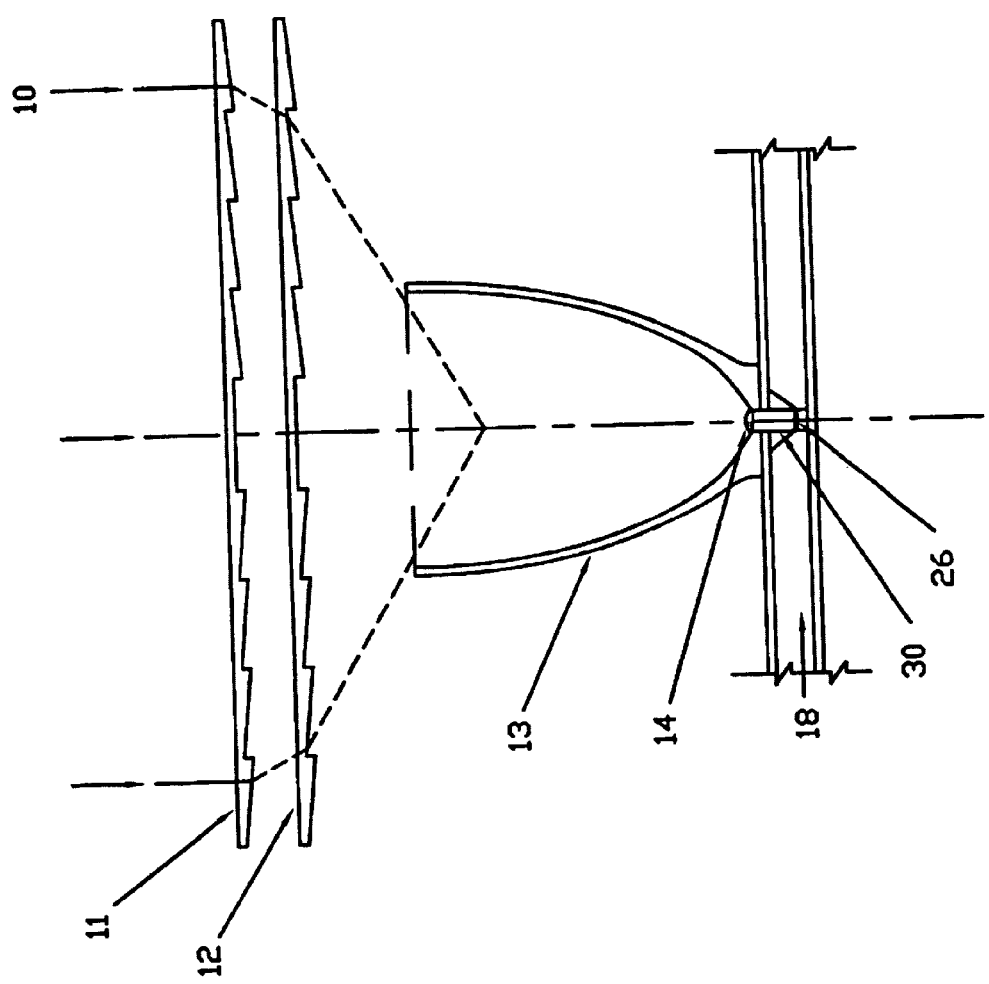

STATIONARY PHOTOVOLTAIC ARRAY MODULE DESIGN FOR SOLAR ELECTRIC POWER GENERATION SYSTEMS

CROSS REFERENCE TO RELATED APPLICATIONS

In accordance with 35 U.S.C. §120, this application is a continuation-in-part application based upon U.S. application Ser. No. 10/047,151, filed on Oct. 23, 2001.

BACKGROUND OF THE INVENTION

1. Field of the Invention

This invention relates to a thin film multi-junction photovoltaic array module of solar electric concentrator power systems.

2. The Prior Art

During the 1990's most photovoltaics with flat plates of silicon solar cells produced electricity at a conversion efficiency of between 15% to 18% of that of commercial market systems. Since then, the Department of Energy and the PV manufacturing industry has substantially improved thin films and multi-Junction solar cells. In 1999, Spectrolab broke the world record when it produced new triple-junction solar cells with a known commercial efficiency of up to 34%.

The fact that the new triple-junction solar cells cost much more than conventional solar cells made it impossible to design photovotaics with flat plates to be solar receivers for electricity production.

U.S. Pat. No. 5,505,789 to Fraas et al discloses a line-focus photovoltaic module using solid optical secondaries for improved radiation resistance. This invention consists of an array of linear arched fresnel lenses with a linear photovoltaic cell receiver located along the focal line of each lens. The optical secondaries may be parabolic in shape.

These systems disclose the combination of fresnel lenses, and parabolic reflectors. U.S. Pat. No. 6,384,320, the disclosure of which is herein incorporated by reference, discloses a combination of a fresnel lens, compound parabolic reflector incorporated with third optical concentration glass lenses and multi-junction solar cells for photovoltaic electric energy conversion.

SUMMARY OF THE INVENTION

A low-cost, high-efficiency, concentrator was designed to be coupled with a much smaller area of expensive solar cell with point focus. The solar electric concentrator is a combination of fresnel lens and optical reflectors which can concentrate solar intensity 300 to 1000 times within a six-inch distance. The solar electric concentrator can be made from low cost, conventional material, and replaces large portions of a module's surface area because its point focus needs a smaller area of expensive solar cells.

The invention relates to a thin film multi-junction photovoltaic array module of solar electric power generation systems. The high performance photovoltaic (PV) array module has multi-junction concentrator solar cells that convert received solar energy to electricity.

A photovoltaic solar cell is a semiconductor device that converts sunlight directly to electricity through the Photovoltaic Effect. One of the important developments of PV applications is the lowering of the system cost through the design of the PV array module to more efficiently convert the sunlight directly to electricity.

The PV array module contains multi-step concentrations of sunlight with Fresnel lenses, CPC reflectors and specially shaped glass lenses that can be made with much smaller surface areas of expensive multi-junction concentrator solar cells in the system. Solar high-concentration and high-efficiency multi-junction solar cells are the essential factors for lowering the cost of PV array modules which produce electricity.

The concentrator has two layers of fresnel lenses concentrating sun rays twice. The second fresnel lens refracts the incoming rays an additional 30°. This larger refraction adds four hours of useful time to the system. The CPC is also readjusted to trap more than eight hours daily of direct-beam solar irradiation. The photovoltaic module tracking device which follows the sun can be eliminated from a solar electric power system. Therefore, the total cost of the whole solar electric system can be reduced by 30%. With this modification, it becomes commercially possible to install the low-cost, high-efficiency stationary concentration photovoltaic solar electric generation systems on the roof of a building or a fixed frame, and connect it to the power grid on a utility scale.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views:

FIG. 1b shows a cross sectional view through A—A of FIG. 1a;

FIG. 2a shows the solar electric concentrator of FIG. 2b having a photovoltaic thin film multi-junction concentrator solar cell with solar intensity concentration of 400 times;

FIG. 2b shows a sectional view through B—B of FIG. 2a;

FIG. 3a shows another embodiment of a solar electric concentrator having an optical fiber and a photovoltaic concentrator solar cell;

FIG. 3b shows a sectional view through C—C of FIG. 3a;

DETAILED DESCRIPTION OF THE PREFERRED EMBODIMENT

Figure 1A:
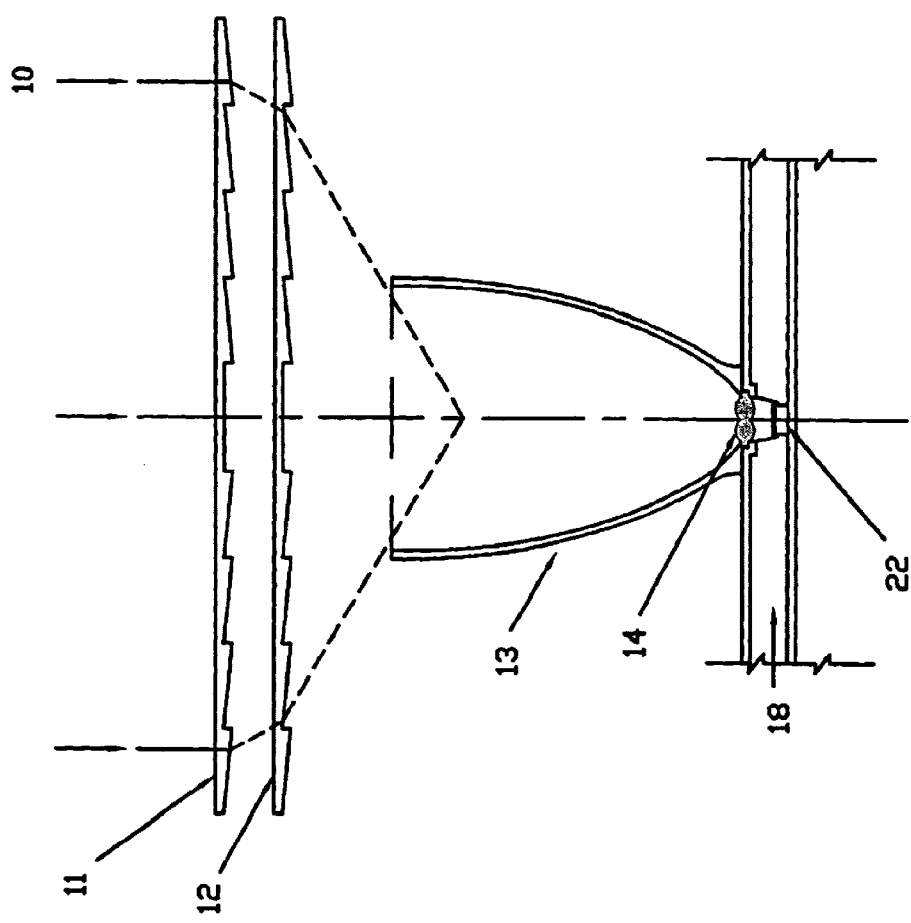
FIG. 1a shows a solar electric concentrator system of a photovoltaic four-junction concentrator solar cell with solar intensity concentration of 1000 times.
Figure 1B:
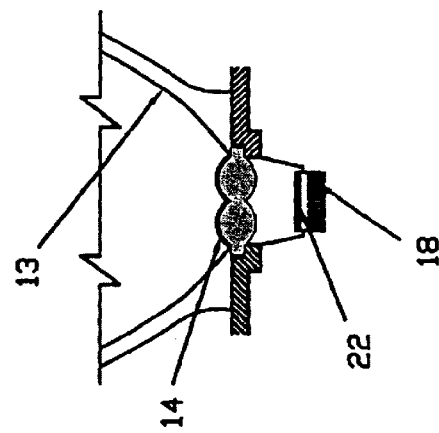

Referring to the drawings and in particular to FIGS. 1a and 1b, a stationary built-in PV concentrator 10 is shown containing first optical concentrator 11 for focusing sun rays five to ten times. Second optical concentrator 12 is disposed below first optical concentrator 11. Third optical concentrator 13 is disposed below second optical concentrator 12. Fourth optical concentrator 14, being a specially shaped glass lens, is disposed at the bottom of third optical concentrator 13. Concentrator solar cell 22 is disposed below fourth optical concentrator 14. Fourth optical concentrator 14 focuses the rays up to 1000 times of the original solar insolation. In addition, solar cell 22 can provide a 45% conversion efficiency with four-junction solar cell. Fluid flows through heat dissipater 18 and is heated by solar cells 22.

In a preferred embodiment, solar cells 22 comprise a Tandem GaInP/GaInAs or GaAs concentrator solar cells. Also in a preferred embodiment, first optical concentrator 11 is a fresnel lens, second optical concentrator 12 is a fresnel lens, and third optical concentrator 13 is a compound parabolic concentrator. Fourth optical concentrator 14 is an optical concentrating glass lens, having one of three different possible shapes for suitable different applications.

The second fresnel lens refracts the incoming rays an additional 30°. This larger refraction adds four hours of useful time to the system. Thus the system may collect solar energy for eight hours a day without the use of a tracking device. The system is efficient enough with the double refraction to satisfy the power requirement on its own.

Third optical concentrator 13 is made of glass-mirror containing a reflective surface coating and several layers of protective materials. The reflective surface coating can also be aluminum foil or a chrome coated metal plate.

Third optical concentrator 13 can be made of a ceramic material having a glass-mirror with a silver-reflective coating covered with several layers of protective materials. The ceramic pad is used to mount third optical concentrator 13 to the concentrator structure with a special adhesive. The protective materials reduce the thermal stress at high operating temperatures.

In another embodiment shown in FIGS. 2a and 2b, solar cell 24 comprises a photovoltaic thin film multi-junction concentrator cell. In FIGS. 3a and 3b, solar electric concentrator 10 contains first optical concentrator 11, second optical concentrator 12, third optical concentrator 13, fourth optical concentrator 14, and an optical fiber 30. Photovoltaic concentrator solar cell 26 is disposed below optical fiber 30. In FIG. 3b, fourth optical concentrator 14 is a glass lens with an anti-reflection coating, connected to an optical fiber 30 with diameter less than 3 mm above the high efficiency multi-junction concentrator solar cells 26 with a concentration rate of 500 times of normal sun rays.

The function of the device can be described as follows:

The focused sunlight from first and second optical concentrators 11, 12 passes through the wider opening aperture (upward opening) of third optical concentration 13, namely the compound parabolic concentration (CPC). Hence, a margin around the circle of rays allows the maximum amount of sunlight possible to be concentrated even if the parabolic concentration is not positioned perpendicularly to the sun. The focused sunlight is continuously reflected by the CPC mirror and is again refocused at the bottom of CPC 13 as a three-dimensional ring of light resembling a donut.

To further harmonize and concentrate the ring of light, three different shapes of solid glass lenses (one with optical (fibers) may be used as fourth optical concentrator 14.

First, as in FIG. 1b, glass lens 14, situated at the bottom of third optical concentrator 13, may have a bra-shaped cross-section. The cross section view of the focused light resembles two crab eyes located at both sides of the base of the cross section view of CPC 13. The cross section of glass lens 14 is used to harmonize the ring of light and to concentrate that light to one thousand times that of normal incoming sunlight intensity after fresnel and CPC lenses. That light then impinges on multi-junction concentrator solar cells 22. Bra-shaped lens 14 is coated with an anti-reflective coating.

Second, as shown in FIG. 2b, where solar cells require fewer degrees of concentration, the crescent-shaped glass lens can be used as fourth optical concentrator 14. This glass lens has a cross-section resembling a crescent. The lens has a convex, upward facing surface having a greater curvature than that of the concave, downward-facing surface. The lens is also coated with an anti-reflective coating.

Third, as shown in FIG. 3b, a half-sphere-shaped small pieced solid glass lens, which has convex upward-facing surface and a flat downward-facing surface, may be used. It is connected to a short length (less than three diameters, with D<3 mm) of optical fiber 30. At the bottom of optical fiber 30, the focused light passes fiber 30 and impinges on concentrator multi-junction solar cells 26. Lens 14 is also coated with anti-reflective coating.

Figure 4:
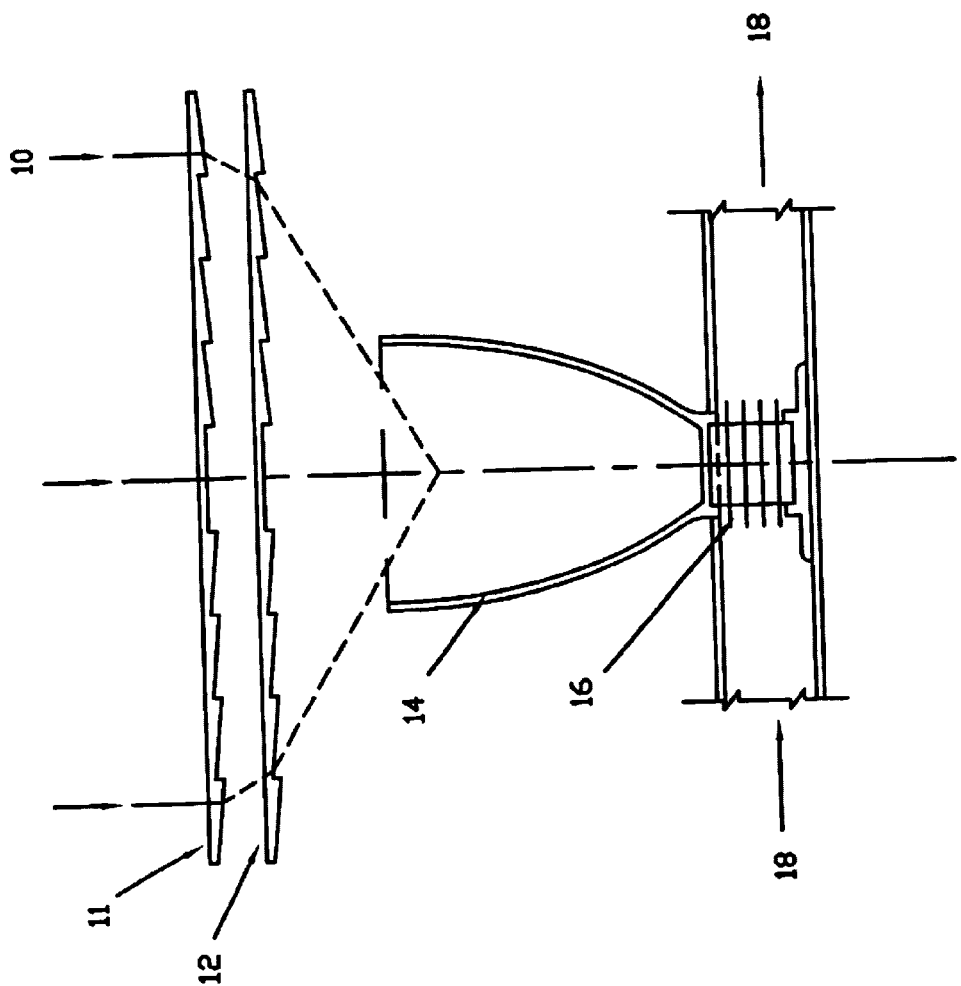
FIG. 4 shows a solar electric concentrator having a heat pipe solar thermal receiver.

FIG. 4 shows collector structure 10 having first fresnel lens 11, disposed above second fresnel lens 12, which is disposed above compound parabolic concentrator 14. Fresnel lenses 11, 12 concentrate the intensity of the sunlight. The focused sunlight is further concentrated 20 to 50 times by compound parabolic concentrator 14. This intensified sunlight is focused on the bottom of CPC 13 where a heat exchanger 16 is located. Fluid 18 flows through heat exchanger 16 and is heated by the concentrated solar energy produced and is increased in pressure.

Figure 5:
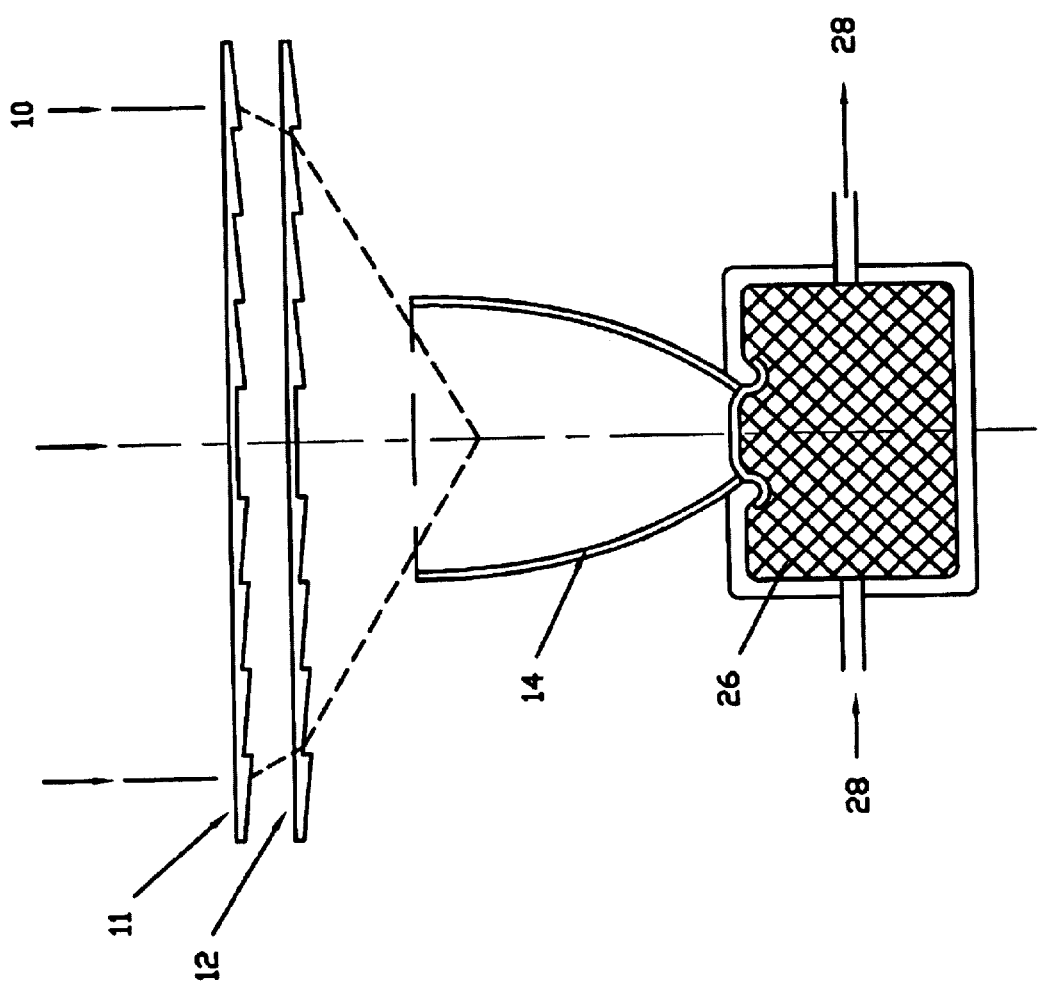
FIG. 5 shows a solar electric concentrator having a honeycomb porous-metal cross flow solar heat receiver.

Heat exchanger 16 is disposed next to the bottom of CPC 14 and may contain a cermet coating, a mixture of ceramic and stainless steel. The cermet coating provides greater heat transfer properties with an absorptivity of 96% of the solar radiation. Heat exchanger 16 can also be designed as a honeycomb porous-metal cross flow solar thermal receiver 32 as shown in FIG. 5. Heat transfer fluid 18 is delivered to a thermal engine to produce electric power.

In the above mentioned embodiments the compound parabolic comprises a reflective coating surface and protective coatings. The reflective coating surface may be aluminum or chrome plated on metal plates. Finally, the systems may be arranged in a flat plate panel.

Accordingly, while only a few embodiments of the present invention have been shown and described, it is obvious that many changes and modifications may be made thereunto without departing from the spirit and scope of the invention.

What is claimed is:

1. A solar photovoltaic array module of an electric power generation system for residential homes comprising:
   a. a plurality of solar electric concentrators with four stages of optical concentration, each solar electric concentrator comprising:
      i. a first optical concentrator, for focusing sun rays such that the rays are concentrated five to ten times their normal intensity;
      ii. a second optical concentrator disposed below said first optical concentrator, for focusing sun rays that have been concentrated by said first optical concentrator;
      iii. a third optical concentrator having a bottom side and being disposed under said second optical concentrator for further concentration of the focused sun rays twenty to fifty times; and
      iv. a fourth optical concentrator, having an upward and downward facing surface, disposed at said bottom side of said third optical concentrator for further concentration of the focused sun rays; and
   b. a plurality of concentrator solar cells disposed below said fourth optical concentrators and having a sets of fins disposed on the bottom of said solar cells.

2. The system according to claim 1, wherein each first optical concentrator comprises a fresnel lens.

3. The system according to claim 1, wherein each second optical concentrator comprises a fresnel lens.

4. The system according to claim 1, wherein each third optical concentrator comprises a compound parabolic concentrator.

5. The system according to claim 4, wherein each compound parabolic concentrator is made of glass.

6. The system according to claim 4, wherein each compound parabolic concentrator is made of ceramic.

7. The system according to claim 4, wherein each compound parabolic concentrator comprises a reflective coating surface and protective coatings.

8. The system according to claim 7, wherein said reflective coating surface is aluminum.

9. The system according to claim 7, wherein said reflective coating surface is chrome plated on metal plates.

10. The system according to claim 1, wherein each fourth optical concentrator comprises an optical concentrator glass lens.

11. The system according to claim 10, wherein each optical concentrator glass lens has a bra-shaped cross section.

12. The system according to claim 10, wherein each optical concentrator glass lens has a convex upward facing surface and a concave downward facing surface of less curvature forming a crescent cross section.

13. The system according to claim 10, wherein each optical concentrator glass lens has a convex upward facing surface and a flat downward facing surface, connecting to an optical fiber.

14. The system according to claim 1, wherein said concentrator solar cells are selected from the group consisting of tandem GaTnP/GaInAs cell and GaAs cell.

15. The system according to claim 1, wherein the system is compatible with triple junction solar cells.

16. The system according to claim 1, wherein the system is compatible with four-junction solar cells.

17. The system according to claim 10, wherein said concentrator glass lens is selected for photovoltaic thin film multi-junction cells.

18. A solar photovoltaic array module of an electric power generation system for residential homes comprising:
   a. a plurality of solar electric concentrators with four stages of optical concentration, each solar electric concentrator comprising:
      i. a first fresnel lens for focusing sun rays such that the rays are concentrated five to ten times their normal intensity;
      ii. a second fresnel lens disposed below said first fresnel lens, for focusing sun rays that have been concentrated by said first fresnel lens;
      iii. a compound parabolic concentrator having a bottom side and being disposed under said second fresnel lens for further concentration of said focused sun rays twenty to fifty times; and
      iv. an optical concentration glass lens disposed at said bottom side of the compound parabolic concentrator; and
   b. a plurality of photovoltaic concentrator solar cells disposed below the optical concentration glass lenses.

19. The system according to claim 18, wherein said each compound parabolic concentrator is made of glass mirror.

20. The system according to claim 18, wherein each compound parabolic concentrator is made of ceramic.

21. The system according to claim 18, wherein each compound parabolic concentrator comprises a reflective coating surface and protective coatings.

22. The system according to claim 21, wherein each reflective coating surface is chrome plated on metal plates.

23. A solar thermal electric power generation system for residential homes comprising:
   a first fresnel lens for focusing sun rays such that the rays are concentrated five to ten times their normal intensity;
   a second fresnel lens disposed below said first fresnel lens, for focusing sun rays that have been concentrated by said first fresnel lens;
   a compound parabolic concentrator having a bottom side and being under said second fresnel lens for further concentration of said focused sun rays twenty to fifty times; and
   a heat pipe exchanger having a plurality of heat pipes for heating heat transfer fluid therein, wherein said heat pipes are disposed on said bottom side of said compound parabolic concentrator;
   wherein said first fresnel lens, said second fresnel lens, said compound parabolic concentrator and said heat pipe exchanger are integrated as a solar compound concentrator; and
   wherein said heat transfer fluid increases in temperature and pressure when passing through said plurality of heat pipes, and said heat transfer fluid is delivered to a thermal engine to produce electric power.

24. The system according to claim 23, wherein said compound parabolic concentrator is made of glass mirror.

25. The system according to claim 23, wherein said compound parabolic concentrator is made of ceramic.

26. The system according to claim 23, wherein said compound parabolic concentrator comprises a reflective coating surface and protective coatings.

27. The system according to claim 26, wherein said reflective coating surface is aluminum.

28. The system according to claim 26, wherein said reflective coating surface is chrome plated on metal plates.

29. The system according to claim 23, wherein said heat pipe heat exchanger comprises a cermet coating.

30. A solar compound concentrator in a solar thermal electric power generation system for residential homes comprising:
   a first fresnel lens for focusing sun rays such that the rays are concentrated five to ten times their normal intensity;
   a second fresnel lens disposed below said first fresnel lens, for focusing sun rays that have been concentrated by said first fresnel lens;
   a compound parabolic concentrator having a bottom side and being disposed under said second fresnel lens for further concentration of said focused sun rays twenty to fifty times;
   a honeycomb mesh-wired cross flow solar receiver for heating heat transfer fluid therein, wherein said honeycomb mesh-wired cross flow solar receiver is disposed on said bottom side of said compound parabolic concentrator;
   wherein said first fresnel lens, said second fresnel lens, said compound parabolic concentrator and said honeycomb mesh-wired cross flow solar receiver are integrated as a solar compound concentrator; and
   wherein said heat transfer fluid increases in temperature and pressure when passing through a plurality of said honeycomb mesh-wired cross flow solar receivers, and said heat transfer fluid is delivered to a thermal engine to produce electric power.

31. The system according to claim 30, wherein said compound parabolic concentrator is made of glass mirror.

32. The system according to claim 30, wherein said compound parabolic concentrator is made of ceramic.

33. The system according to claim 30, wherein said compound parabolic concentrator comprises a reflective coating surface and protective coatings.

34. The system according to claim 33, wherein said reflective coating surface is aluminum.

35. The system according to claim 33, wherein said reflective coating surface is chrome plated on metal plates.

36. A solar thermal electric power generation system for residential homes comprising:

a first fresnel lens for focusing sun rays such that the rays are concentrated five to ten times their normal intensity;

a second fresnel lens disposed below said first fresnel lens, for focusing sun rays that have been concentrated by said first fresnel lens;

a compound parabolic concentrator having a bottom side and being disposed under said second fresnel lens for further concentration of said focused sun rays twenty to fifty times;

a heat exchanger for heating heat transfer fluid therein, wherein said exchanger is disposed on said bottom side of said compound parabolic concentrator; wherein said first fresnel lens, said second fresnel lens, said compound parabolic concentrator and said heat exchanger are integrated as a solar compound concentrator;

wherein the diameter of said compound parabolic concentrator at the top of its aperture is wider than a range of movement of the focal points of each fresnel lens, so that said solar compound concentrator is arranged in a flat plate panel to collect direct solar irradiation for a period of time without tracking the movement of the sun; and wherein said heat transfer fluid increases in temperature and pressure as it passes through a plurality of said heat exchangers, and said heat transfer fluid is delivered to a thermal engine to produce electric power.

* * * * *